United States Patent [19]

Isawa et al.

[11] Patent Number: 5,444,039
[45] Date of Patent: Aug. 22, 1995

[54] (HG,PB)-BA-CA-CU-O SUPERCONDUCTOR AND METHOD OF MANUFACTURING THE SAME

[75] Inventors: Kazuyuki Isawa, Tokyo; Ayako Yamamoto, Minamiashigara; Makoto Itoh, Tokyo; Seiji Adachi, Urayasu; Hisao Yamauchi, Nagareyama, all of Japan

[73] Assignees: Tohoku Electric Power Copany, Incorporated, Miyagi; Sumitomo Electric Industries, Ltd.; Matsushita Electric Industrial Co., Ltd., both of Osaka; International Superconductivity Technology Center, Tokyo, all of Japan

[21] Appl. No.: 304,494

[22] Filed: Sep. 12, 1994

[30] Foreign Application Priority Data

Sep. 17, 1993 [JP] Japan .................. 5-231891

[51] Int. Cl.$^6$ .................. C01F 11/02; C01G 3/02
[52] U.S. Cl. .................. 505/125; 505/500; 505/490; 505/785; 505/776; 505/739; 423/593; 423/596; 252/518; 252/521
[58] Field of Search .............. 505/125, 739, 500, 490, 505/776, 785; 423/596, 593; 252/518, 521

[56] References Cited

U.S. PATENT DOCUMENTS 5,081,074  1/1992  Murayama et al. .................. 505/701
5,317,008  5/1994  Imai .................. 505/100

OTHER PUBLICATIONS

Xue et al, "Pb-doping effects in Hgr$_x$Pb$_x$Ba$_2$Ca$_2$Cu$_3$O$_{8+\delta}$", Modern Physics letters B, vol. 7, No. 28, pp. 1833–1842, Dec. 10, 1993.

Nature, vol. 353, May 6, 1993, pp. 56–58, Superconductivity above 130K in the Hg–Ba–Ca–Cu–O System, A. Schilling et al.

Physica C–162–164, (1989) pp. 291–295, North-Holland, Disappearance of High Temperature Superconductivity Induced by High Carrier Concentrations, J. Torrance et al.

Physical Review B, bol. 46, No. 22, Dec. 1, 1992, pp. 14928–14931, Systematics in the Thermoelectric Power of High–T$_c$ Oxides, S. Obertelli et al.

The 1993 International Workshop on Superconductivity, Jun. 28–Jul. 1, 1993, Hakodate, Japan, Influence of Electric States of Bi–O) Layer on Irreversibility Magnetic Fields . . . , Toshihide Nabatame, et al pp. 230–231.

Phys. Chem. Molec. Oxide Superconductors, USA, Jul. 27–31, 1993 Crystal Structure and Anisotropy of Iodine–intercalated . . . , K. Kishio et al, pp. 1–11.

Primary Examiner—Roy V. King
Attorney, Agent, or Firm—Frishauf, Holtz, Goodman, Langer & Chick

[57] ABSTRACT

The oxide superconductor according to the present invention is represented by $(Hg_{1-x}Pb_x)Ba_2Ca_2Cu_3O_\delta$ ($0.08 \leq x \leq 0.41$, $7.625 \leq \delta \leq 9.15$), and has a crystal structure in which a lamination unit of (Hg, Pb)O$_z$-BaO-CuO$_2$-Ca-CuO$_2$-Ca-CuO$_2$-BaO is laminated in a c-axial direction of the crystal structure ($0.625 \leq z \leq 2.15$). Further, the method of manufacturing an oxide superconductor, according to the present invention, includes the steps of: mixing material powders of HgO, PbO, BaO, CaO and CuO at a mole ratio of $(Hg_{1-x}Pb_x)$:Ba:Ca:Cu=a:2:b:c ($1 \leq a \leq 2.5$, $2 \leq b \leq 3$, $2.5 \leq c \leq 4$) and compression-molding the mixture powder into a compact; and subjecting the compact to a thermal treatment at 600°–750° C.

8 Claims, 3 Drawing Sheets

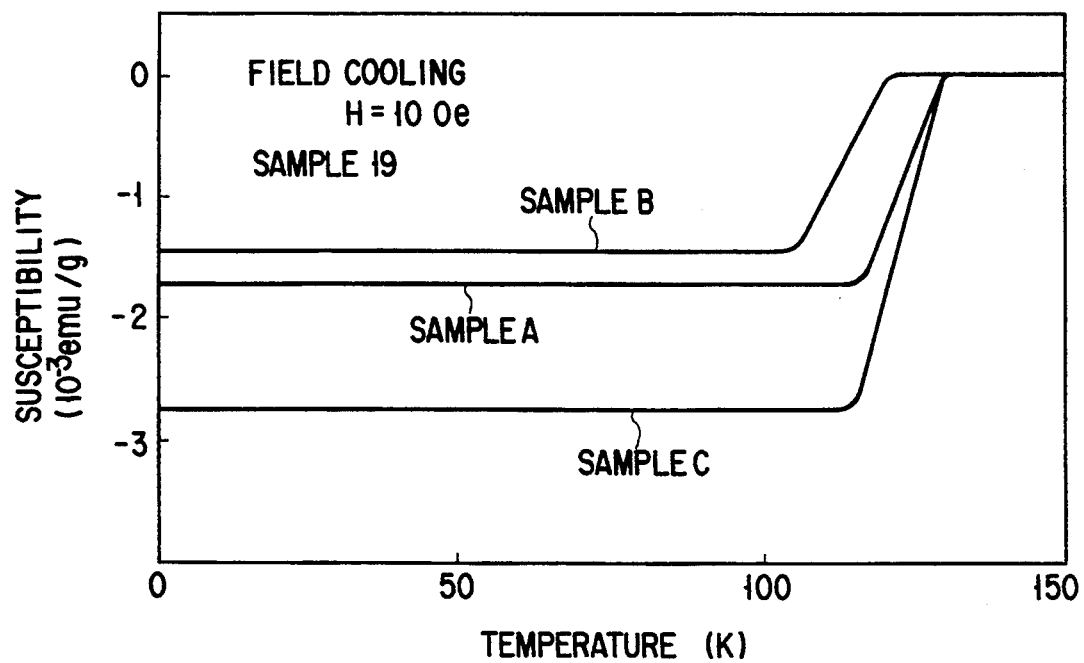
F I G. 4

(HG,PB)-BA-CA-CU-O SUPERCONDUCTOR AND METHOD OF MANUFACTURING THE SAME

BACKGROUND OF THE INVENTION

1. Field of the Invention

The present invention relates to a Hg-based 1223-type oxide superconductor which exhibits superconductive properties at a temperature higher than liquid nitrogen temperature, and a method of manufacturing the oxide superconductor.

2. Description of the Related Art

Superconductors have unique properties, in which the electric resistance is rendered zero at a critical temperature (to be abbreviated as Tc, hereinafter), the diamagnetism and Josephson effect are exhibited. The superconductors are expected to be applied in a wide range of technological field including power cables without current loss, superconducting generator, high field magnets for nuclear fusion plasma confinement, materials for magnetic levitation vehicle, magnetic sealed materials, and high-speed computers.

It is reported that the superconducting properties have been confirmed in about 30 types of copper oxides after the discovery of the La-Ba-Cu-O-based superconductor having Tc of about 30K in 1986 by Bednorz and Muller. In particular, the Tl-Ba-Ca-Cu-O-based superconductor has a Tc of 125K, and much attention is paid thereto as a material having the highest Tc ever. Recently, it has been reported that the Hg-Ba-Ca-Cu-O-based superconductor (1223 type) exhibits a Tc of 133.5K (A. Schiling et al., Nature (London) 363.56 (1993).

The Hg-Ba-Ca-Cu-O-based superconductor is prepared in the following method. First, the precursor e.g., $Ba_2Ca_2Cu_3O_7$, $BaCuO_2$, $Ca_2CuO_3$ or other oxides is prepared, and HgO is mixed thereinto. The mixture is further subjected to a thermal treatment at a temperature of 800°–850° C., for 10 hours, thus obtaining the superconductor.

However, the Hg-Ba-Ca-Cu-O-based superconductor entails problems, i.e. it contains mercury which is poisonous, it requires much time in its production since HgO must be mixed with the precursor, and it has a low reproducibility. Further, the crystal structure of the Hg-Ba-Ca-Cu-O-based superconductor has a large anisotropy, and therefore it is expected that the superconductive properties including the critical current density in a magnetic field, are very low.

SUMMARY OF THE INVENTION

The present invention has been proposed under the above-described circumstances, and the object thereof is to provide a new oxide superconductor which is innoxious and exhibits excellent superconducting properties, and a method of manufacturing such an oxide superconductor at a high efficiency and a high reproducibility.

The present invention proposes an oxide superconductor represented by $(Hg_{1-x}Pb_x)Ba_2Ca_2Cu_3O_\delta$ ($0.08 \leq x \leq 0.41$, $7.625 \leq \delta \leq 9.15$), and having a crystal structure in which a blocking layer of (Hg, Pb)$O_z$-BaO-$CuO_2$-Ca-$CuO_2$-Ca-$CuO_2$-BaO is laminated in a c-axis direction of the crystal structure ($0.625 \leq z \leq 2.15$).

The present invention also proposes a method of manufacturing aforementioned new oxide superconductor, comprising the steps of: mixing material powders of HgO, PbO, BaO, CaO and CuO at a mole ratio of $(Hg_{1-x}Pb_x):Ba:Ca:Cu = a:2:b:c$ ($1 \leq a \leq 2.5$, $2 \leq b \leq 3$, $2.5 \leq c \leq 4$), thereby obtaining mixture powder; compression-molding the mixture powder, thereby obtaining a compact; and subjecting the compact to a first thermal treatment at 600°–750° C., thereby obtaining the oxide superconductor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a graph showing the relationship between a dc magnetic susceptibility and a temperature for illustrating the effect of the second thermal treatment regarding the oxide superconductor.

DETAILED DESCRIPTION OF THE PREFERRED EMBODIMENTS

Figure 1:
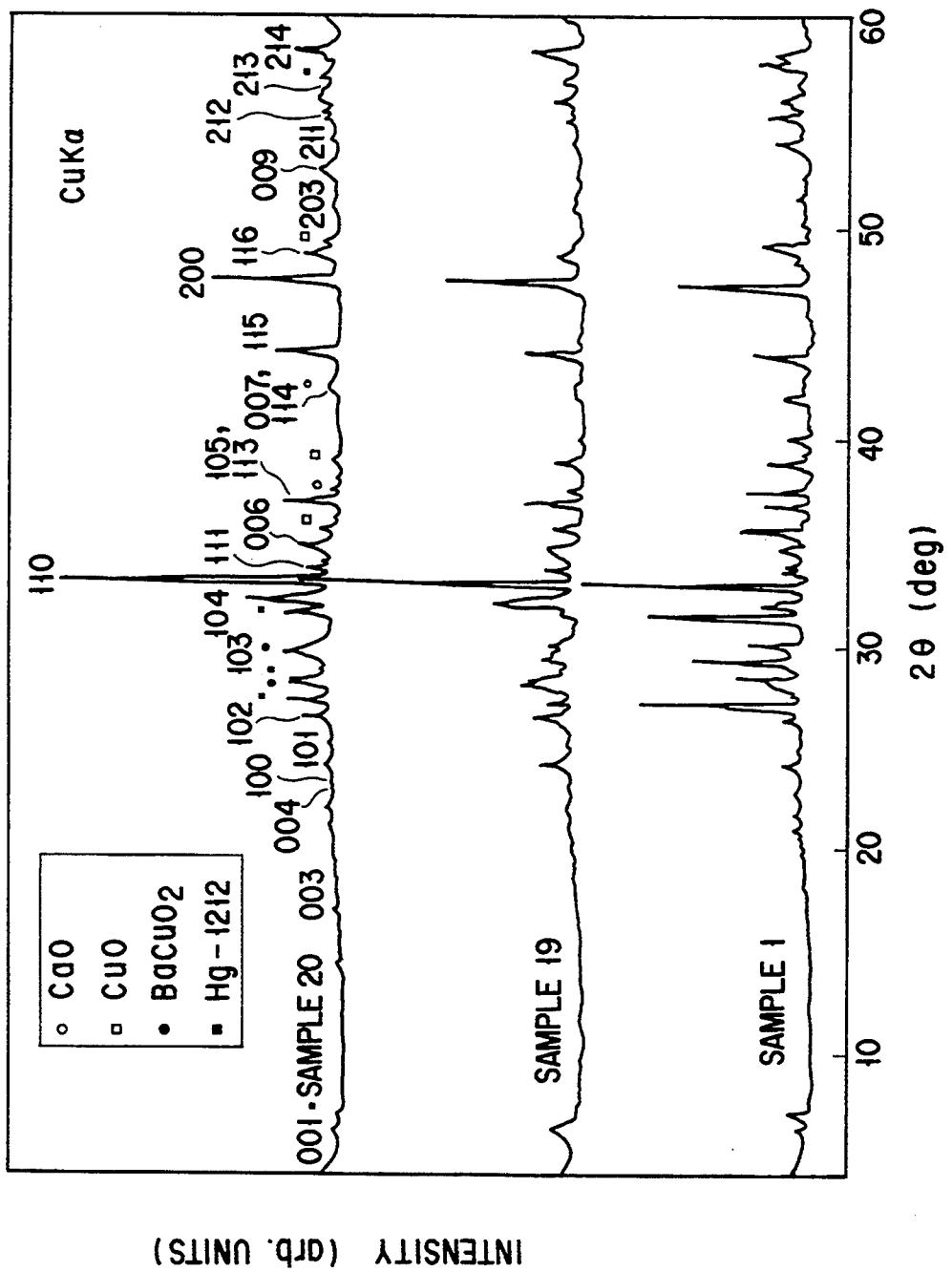
FIG. 1 is a characteristic diagram showing the result of a powder X-ray diffraction pattern of an oxide superconductor according to the present invention.

The present invention provides an oxide superconductor represented by $(Hg_{1-x}Pb_x)Ba_2Ca_2Cu_3O_\delta$ ($0.08 \leq x \leq 0.41$, $7.625 \leq \delta \leq 9.15$), and having a crystal structure in which a blocking layer of (Hg, Pb)$O_z$-BaO-$CuO_2$-Ca-$CuO_2$-Ca-$CuO_2$-BaO is laminated in a c-axial direction of the crystal structure ($0.625 \leq z \leq 2.15$).

In the oxide superconductor having the above composition, Pb is contained in the Hg site as solid solution. This is because Pb is an element which is easy to substitute the Hg site, and a high Tc superconducting property of the Hg-based oxide superconductor does not deteriorate even if Pb ion is contained as solid solution. Further, when Pb is contained in the Hg site as solid solution, as mentioned above, the content of Hg is relatively decreased, reducing the danger in the Hg-based oxide superconductor.

The present invention also provides a method of manufacturing an oxide superconductor, comprising the steps of: mixing material powders of HgO, PbO, BaO, CaO and CuO at a mole ratio of $(Hg_{1-x}Pb_x):Ba:Ca:Cu = a:2:b:c$ ($1 \leq a \leq 2.5$, $2 \leq b \leq 3$, $2.5 \leq c \leq 4$); compression-molding the powder mixture into a compact; and subjecting the compact to a thermal treatment at 600°–750° C.

The Pb-substituted Hg-based oxide superconductor $(Hg_{1-x}Pb_x)Ba_2Ca_2Cu_3O_\delta$, i.e., (Hg, Pb)-1223 type superconductor (Pb is contained in the Hg site as solid solution) can be obtained by the usual dry method, and therefore the superconductor can be reproduced at a high reproducibility. Further, when the obtained oxide superconductor is subjected to the second thermal treatment in an argon gas atmosphere or oxygen atmosphere, a particular state in which a copper oxide exhibits a high Tc, i.e. the average valency of Cu ions is 2.05 to 2.5, can be realized by adjustment. Consequently, the oxide superconductor exhibits a higher Tc.

In the oxide superconductor of the present invention, parameter x in the composition of $(Hg_{1-x}Pb_x)Ba_2Ca_2Cu_3O_\delta$ is limited to $0.08 \leq x \leq 0.41$. This is because if x is less than 0.08, the same effect as that of the conventional Hg-based material is imparted, and the effect of adding Pb is not expected, whereas if x exceeds 0.41, the superconducting properties are deteriorated. Further, parameter $\delta$ is limited to $7.625 \leq \delta \leq 9.15$. It is generally confirmed that a copper oxide superconductor exhibits the superconducting properties when the average valency of Cu ions is $+2.05$ to $+2.5$ (J. B. Torrance et al., Physica C 162-164, 291 (1989)). Based on this valency, the range of $\delta$ is defined as $7.625 \leq \delta \leq 9.15$. Further, parameter z in the lamination unit is limited to $0.625 \leq z \leq 2.15$. This is because if z is 0.625 or less or 2.15 or higher, the crystal structure of the oxide superconductor according to the present invention cannot be established.

In the method of manufacturing an oxide superconductor of the present invention, a compact prepared by compression-molding mixture powder is subjected to the first thermal treatment at a temperature of 600°–750° C., thus manufacturing an oxide superconductor. This is because if the first thermal treatment temperature is less than 600° C., the material powders do not react with each other, not forming an oxide superconductor, whereas if it exceeds 750° C., the compact is molten.

It is preferable that the obtained oxide superconductor is further subjected to the second thermal treatment in flowing argon gas or oxygen gas atmosphere. In the second thermal treatment, the temperature should preferably be 100°–400° C., and the treatment time period should be 2–3 hours or more. The second thermal treatment is carried out for setting the average valency of Cu ions in a range of 2.05–2.5 in order to enhance Tc, by adjusting the oxygen content in $(Hg_{1-x}Pb_x)Ba_2Ca_2Cu_3O_\delta$, i.e. changing the $\delta$ value. The conditions for the second thermal treatment (including temperature, time, flow rate of introduced gas) are appropriately set by the $\delta$ value of the obtained oxide superconductor.

Regarding the Hg-Ba-Ca-Cu-O-based superconductor, the $(Hg, pb)O_\delta$ layer is stabilized by adding Pb, and therefore excessive oxygen is incorporated. Consequently, in the case where the second thermal treatment is carried out in an oxygen gas atmosphere, the superconductor is rendered in the overdope state, improving the superconducting properties such as Jc in a magnetic field.

Examples of the present invention will now be described in detail.

Example 1

An HgO power having a purity of 99%, a PbO power having a purity of 99.9%, a BaO powder having a purity of 99%, a CaO powder having a purity of 99.9%, and a CuO powder having a purity of 99.9%, were mixed together at a stoichiometrically mixture ratio of $(Hg_{1-x}Pb_x):Ba:Ca:Cu = a:2:b:c$, where $a=1.0$, $b=2.0$, $c=3.0$ and $x=0.20$, thus obtaining a mixture powder.

The mixture powder was pressed at 500 kg/cm³, thereby obtaining a bar having dimensions of 2×2 mm and a length of 20 mm. The bar was inserted into a metal pipe having an outer diameter of 5.6 mm, an inner diameter of 5.4 mm, a length of 30 mm, and the pipe was placed in a quartz ampule. It is not always necessary to insert the bar into a metal pipe. Next, the pressure inside the quartz ampule was reduced to about $1 \times 10^{-4}$ Torr, and then the ampule was sealed by using a gas burner.

The quartz ampule was set in an electric furnace, and subjected to the first thermal treatment at 675° C. for 1 hour, so as to sinter the mixture powder. After that, the quartz ampule was put into water to rapidly cool it (quench). The pipe was removed from the quartz ampule after the first thermal treatment, and the rod member of the oxide superconductor of a sample 1 was taken out of the pipe. The rod member was crushed into powder, and the crystallogrophic structure of the oxide superconductor was analyzed to the powder X-ray diffraction. The results were as shown in FIG. 1. It was confirmed from FIG. 1 that the (Hg, Pb)-1223-type oxide superconductor was obtained. The component ratio (Hg:Pb):Ba:Ca:Cu of the oxide superconductor was examined by the energy dispersive X-ray spectroscopy (EDX) analyzer. The results were summarized in Table 1 below. The oxide superconductor of the sample 1 was examined under an electron microscope, and it was found that the precipitation of Pb was not found and Pb was incorporated with the Hg-based superconductor as solid solution. Further, Tc (diamagnetic temperature) of the oxide superconductor of the sample 1 was examined by the superconducting quantum interference device (SQUID) magnetometer. The results thereof were also summarized in Table 1.

TABLE 1

| Sample | $(Hg_{1-x}Pb_x):Ba:Ca:Cu = a:2:b:c$ | | | | (Hg:Pb):Ba:Ca:Cu | Superconducting properties | Tc (K) | First thermal treatment condition |
|---|---|---|---|---|---|---|---|---|
| | a | b | c | x | | | | |
| 1 | 1.0 | 2.0 | 3.0 | 0.20 | (0.78:0.23):2:1.89:2.36 | Present | 130 | 675° C. × 1 h |
| 2 | 1.0 | 2.0 | 3.0 | 0.10 | (0.87:0.08):2:1.85:2.53 | Present | 128 | 675° C. × 1 h |
| 3 | 1.0 | 2.0 | 3.0 | 0.15 | (0.67:0.12):2:1.89:2.65 | Present | 127 | 675° C. × 1 h |
| 4 | 1.0 | 2.0 | 3.0 | 0.25 | (0.88:0.22):2:1.84:2.45 | Present | 130 | 675° C. × 1 h |
| 5 | 1.0 | 2.0 | 3.0 | 0.30 | (0.90:0.31):2:1.64:2.57 | Present | 129 | 675° C. × 1 h |
| 6 | 1.0 | 2.0 | 3.0 | 0.35 | (0.75:0.28):2:1.58:2.61 | Present | 128 | 675° C. × 1 h |
| 7 | 1.0 | 2.0 | 3.0 | 0.40 | (0.81:0.41):2:1.67:2.41 | Present | 130 | 675° C. × 1 h |
| 8 | 1.0 | 2.0 | 3.0 | 0.05 | (0.75:0.04):2:1.80:2.43 | Absent | — | 675° C. × 1 h |
| 9 | 1.0 | 2.0 | 3.0 | 0.45 | (0.74:0.42):2:1.78:2.32 | Absent | — | 675° C. × 1 h |
| 10 | 1.0 | 2.0 | 3.0 | 0.50 | (0.69:0.40):2:1.58:2.78 | Absent | — | 675° C. × 1 h |
| 11 | 1.0 | 2.0 | 3.0 | 0.55 | (0.61:0.36):2:1.67:2.41 | Absent | — | 675° C. × 1 h |

Next, samples 2–11 were prepared in the same procedure as above except that parameters a, b, c and x of $(Hg_{1-x}Pb_x):Ba:Ca:Cu=a:2:b:c$ were varied as indicated in Table 1. The composition ratio and Tc of each of the samples were measured in the same procedure as the case of the sample 1. The results were also summarized in Table 1.

As is clear from Table 1, the samples 1 to 7, which satisfied the range of x defined by the present invention, were oxide superconductors, and each exhibited a high Tc. In contrast, the samples 8-11, which had x values falling out of the range defined by the present invention, did not become oxide superconductors.

Example 2

Samples 12-18 were prepared in the same procedure as the case of the sample 1 except that the thermal treatment conditions specified in Table 2 below were set as the first thermal treatment conditions. The composition ratio and Tc of each of the samples were measured in the same procedure as the case of the sample 1. The results were also summarized in Table 2.

TABLE 2

| Sample | $(Hg_{1-x}Pb_x)$:Ba:Ca:Cu = a:2:b:c | | | | (Hg:Pb):Ba:Ca:Cu | Super-conducting properties | Tc (K) | First thermal treatment condition |
|---|---|---|---|---|---|---|---|---|
| | a | b | c | x | | | | |
| 12 | 1.0 | 2.0 | 3.0 | 0.20 | (0.78:0.23):2:1.59:2.48 | Present | 128 | 600° C. × 1 h |
| 13 | 1.0 | 2.0 | 3.0 | 0.20 | (0.81:0.26):2:1.67:2.61 | Present | 130 | 650° C. × 1 h |
| 14 | 1.0 | 2.0 | 3.0 | 0.20 | (0.79:0.20):2:1.77:2.36 | Present | 129 | 700° C. × 1 h |
| 15 | 1.0 | 2.0 | 3.0 | 0.20 | (0.86:0.17):2:1.55:2.56 | Present | 129 | 725° C. × 1 h |
| 16 | 1.0 | 2.0 | 3.0 | 0.20 | (0.76:0.26):2:1.73:2.48 | Present | 129 | 750° C. × 1 h |
| 17 | 1.0 | 2.0 | 3.0 | 0.20 | (0.71:0.09):2:1.56:2.66 | Absent | — | 550° C. × 1 h |
| 18 | 1.0 | 2.0 | 3.0 | 0.20 | (0.89:0.22):2:1.45:2.78 | Absent | — | 775° C. × 1 h |

As is clear from Table 2, the samples 12 to 16, which were subjected to the thermal treatment at a temperature satisfying the range of the first thermal treatment temperature, defined by the present invention, were oxide superconductors, and each exhibited a high Tc. In contrast, the samples 17 and 18, which were treated at a temperature falling out of the range of the first thermal treatment, defined by the present invention, did not become oxide superconductors.

Example 3

Samples 19-23 were prepared in the same procedure as the case of the sample 1 except that the parameter a of $(Hg_{1-x}:Pb_x)$:Ba:Ca:Cu=a:2:b:c was varied as indicated in Table 3. The composition ratio and Tc of each of the samples were measured in the same procedure as the case of the sample 1. The results were also summarized in Table 3. The samples 19 and 20 were subjected to the powder X-ray diffraction, and the results were summarized in FIG. 1.

Figure 2:
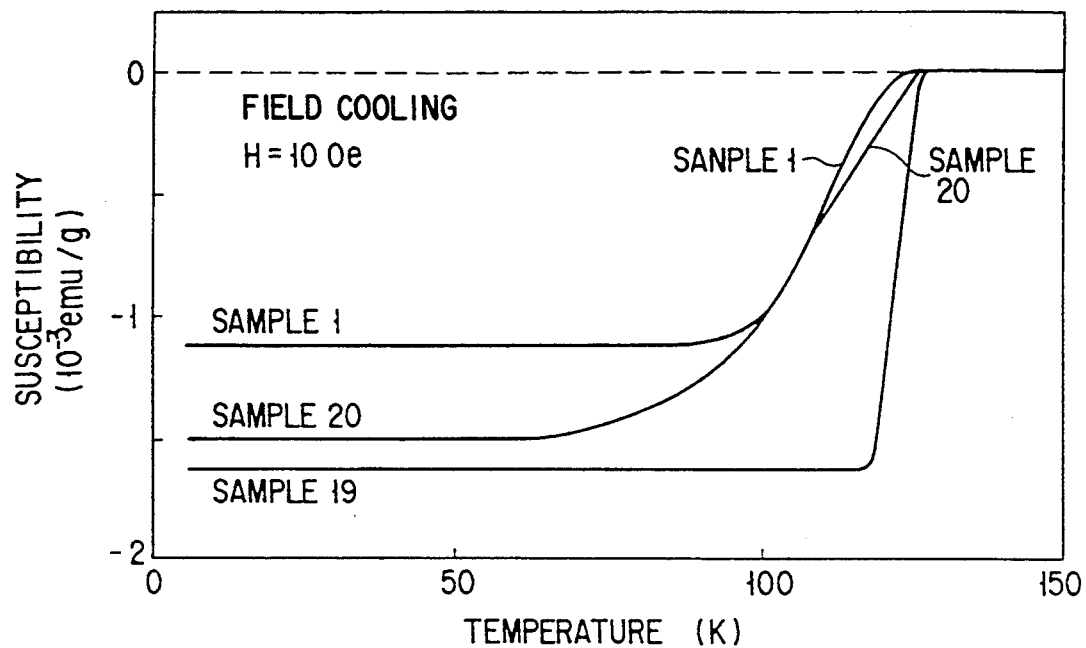
FIG. 2 is a graph showing the temperature dependence of a dc magnetic susceptibility regarding the oxide superconductor of the invention.

On the other hand, the samples 1, 19 and 20 were examined in terms of the temperature dependence dc magnetic susceptibility, and the results were summarized in FIG. 2. The susceptibility was measured by the SQUID magnetometer. As is clear from FIG. 2, any of the samples exhibited a diamagnetism at the temperature below 130K. The Meissner signal of the oxide superconductor is known to be around $-1.2\times 10^{-2}$ emu/g if the volume fraction is 100%. As shown in FIG. 2, the susceptibility was measured in a field cooling mode applying magnetic field of H=10 Oe, and the Meissner volume fraction at 5K was estimated to be 10% to 20% as compared to $-1.2\times 10^{-2}$ emu/g. In addition, to 100% diamagnetic signal was observed at 5K for the case of zero field cooling measurement.

Figure 3:
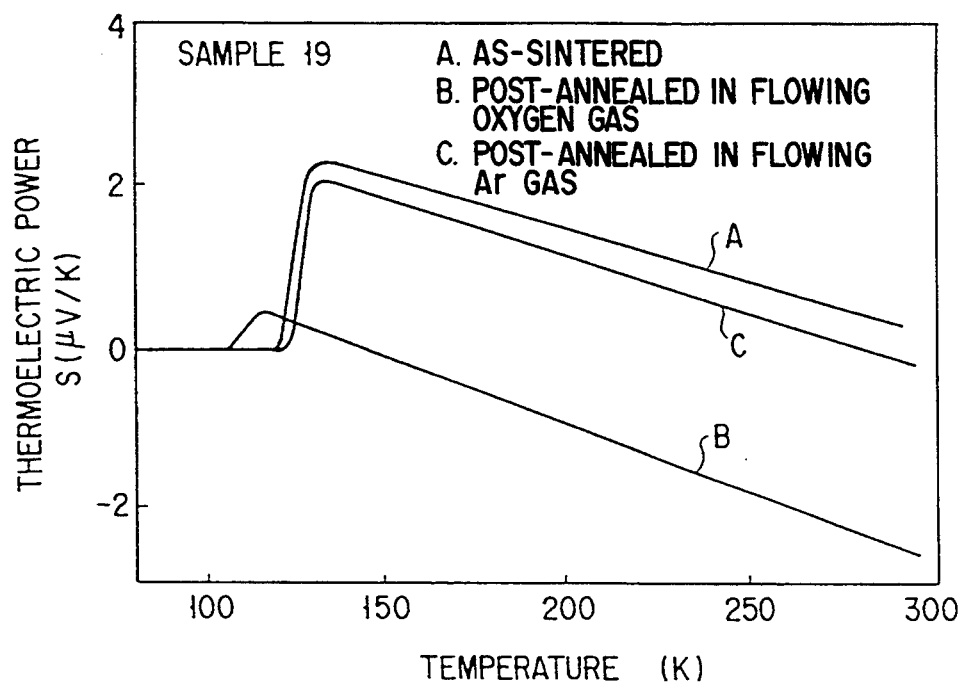
FIG. 3 is a graph showing the temperature dependence of thermoelectric power regarding the oxide superconductor.

Further, the thermoelectric power of the sample 19 before and after the second thermal treatment was examined. The results were summarized in FIG. 3. It is judged from FIG. 3, that the sample 19 was in the overdope state, for the following reason.

The main carrier of an Hg-based superconductor is considered to be hole, and therefore, the Seebeck coefficient should be positive. However, the sign of the Seebeck coefficient of the sample 19 after annealed in the oxygen atmosphere is negative in a wide range of 150-300K. Consequently, the sample is judged to be in the overdope state.

It is reported that previously known high Tc superconductors other than those of Hg-based have tendencies as mentioned above. (See, for example, S. D. Obertelli et al. Phys. Rev. B46('93) 14928).

Thus, it is concluded that the sample 19 had excellent superconducting properties in a magnetic field as reported for the Bi-based oxide superconductor (K. Kishio et al., J. Superconductivity, 1994, or T. Nabatame et al., Proc. of International Workshop on Superconductivity, Hakodate, 1993).

TABLE 3

| Sample | $(Hg_{1-x}Pb_x)$:Ba:Ca:Cu = a:2:b:c | | | | (Hg:Pb):Ba:Ca:Cu | Super-conducting properties | Tc (K) | First thermal treatment condition |
|---|---|---|---|---|---|---|---|---|
| | a | b | c | x | | | | |
| 19 | 1.5 | 2.0 | 3.0 | 0.20 | (0.88:0.43):2:1.84:2.45 | Present | 130 | 675° C. × 1 h |
| 20 | 2.0 | 2.0 | 3.0 | 0.20 | (0.81:0.36):2:1.67:2.41 | Presnet | 127 | 675° C. × 1 h |
| 21 | 2.5 | 2.0 | 3.0 | 0.20 | (0.78:0.27):2:1.89:2.36 | Present | 130 | 675° C. × 1 h |
| 22 | 0.5 | 2.0 | 3.0 | 0.20 | — | Absent | — | 675° C. × 1 h |
| 23 | 3.0 | 2.0 | 3.0 | 0.20 | — | Absent | — | 675° C. × 1 h |

As is clear from Table 3, the samples 19 to 21, which satisfied the range of a defined by the present invention, were oxide superconductors, and each exhibited a high Tc. In contrast, the samples 22 and 23, which had a values falling out of the range defined by the present invention, did not become oxide superconductors.

Example 4

Samples 24-28 were prepared in the same procedure as the case of the sample 1 except that the parameter b of $(Hg_{1-x}:Pb_x)$:Ba:Ca:Cu=a:2:b:c was varied as indicated in Table 4 below. The composition ratio and Tc of each of the samples were measured in the same manner as the case of the sample 1. The results were also summarized in Table 4.

ered, the superconducting properties in a magnetic field are expected to be higher.

TABLE 4

| Sample | $(Hg_{1-x}Pb_x):Ba:Ca:Cu$ = a:2:b:c | | | | (Hg:Pb):Ba:Ca:Cu | Superconducting properties | Tc (K) | First thermal treatment condition |
|---|---|---|---|---|---|---|---|---|
| | a | b | c | x | | | | |
| 24 | 1.5 | 2.5 | 3.0 | 0.20 | (0.81:0.21):2:1.67:2.41 | Present | 129 | 675° C. × 1 h |
| 25 | 1.5 | 3.0 | 3.0 | 0.20 | (0.84:0.22):2:1.78:2.32 | Present | 129 | 675° C. × 1 h |
| 26 | 1.5 | 1.0 | 3.0 | 0.20 | — | Absent | — | 675° C. × 1 h |
| 27 | 1.5 | 1.5 | 3.0 | 0.20 | — | Absent | — | 675° C. × 1 h |
| 28 | 1.5 | 3.5 | 3.0 | 0.20 | — | Absent | — | 675° C. × 1 h |

As is clear from Table 4, the samples 24 to 25, which satisfied the range of b defined by the present invention, were oxide superconductors, and each exhibited a high Tc. In contrast, the samples 26 to 28, which had b values falling out of the range defined by the present invention, did not become oxide superconductors.

Example 5

Samples 29–36 were prepared in the same procedure as the case of the sample 1 except that the parameter c of $(Hg_{1-x}:Pb_x):Ba:Ca:Cu=a:2:b:c$ was varied as indicated in Table 5 below. The composition ratio and Tc of each of the samples were measured in the same manner as the case of the sample 1. The results were also summarized in Table 5.

TABLE 5

| Sample | $(Hg_{1-x}Pb_x):Ba:Ca:Cu$ = a:2:b:c | | | | (Hg:Pb):Ba:Ca:Cu | Superconducting properties | Tc (K) | First thermal treatment condition |
|---|---|---|---|---|---|---|---|---|
| | a | b | c | x | | | | |
| 29 | 1.5 | 2.0 | 2.5 | 0.20 | (0.81:0.26):2:1.67:2.61 | Present | 130 | 675° C. × 1 h |
| 30 | 1.5 | 2.0 | 3.5 | 0.20 | (0.79:0.20):2:1.77:2.76 | Present | 129 | 675° C. × 1 h |
| 31 | 1.5 | 2.0 | 4.0 | 0.20 | (0.86:0.17):2:1.55:3.16 | Present | 129 | 675° C. × 1 h |
| 32 | 1.5 | 2.0 | 1.0 | 0.20 | — | Absent | — | 675° C. × 1 h |
| 33 | 1.5 | 2.0 | 1.5 | 0.20 | — | Absent | — | 675° C. × 1 h |
| 34 | 1.5 | 2.0 | 2.0 | 0.20 | — | Absent | — | 675° C. × 1 h |
| 35 | 1.5 | 2.0 | 4.5 | 0.20 | — | Absent | — | 675° C. × 1 h |
| 36 | 1.5 | 2.0 | 5.5 | 0.20 | — | Absent | — | 675° C. × 1 h |

As is clear from Table 5, the samples 29 to 31, which satisfied the range of c defined by the present invention, were oxide superconductors, and each exhibited a high Tc. In contrast, the samples 32 to 36, which had c values falling out of the range defined by the present invention, did not become oxide superconductors.

Example 6

In connection with the sample 19, one type (sample A) which was subjected only up to the first thermal treatment, another type (sample B) which was subjected up to the second thermal treatment at 300° C. for 10 hours in an oxygen atmosphere, and still another type (sample C) which was subjected up to the second thermal treatment at 300° C. for 5 hours in an argon atmosphere were prepared. The samples A to C were examined in terms of the temperature dependency of the susceptibility in similar to the case of Example 3. The results were summarized in FIG. 4.

As can be seen from FIG. 4, the sample B, which was subjected to the second thermal treatment in the oxygen atmosphere, had a Tc of 122K, which is lower than that of the sample A. The sample B has a large amount of oxygen, i.e. a large δ value, and is a sample which is in the overdope state. Although the Tc value was low- Therefore, it is preferable that a sample in an overdope state be obtained by carrying out the second thermal treatment with a selection of an atmosphere in accordance with the δ value of the oxide superconductor.

As described, the oxide superconductor according to the present invention is represented by $(Hg_{1-x}Pb_x)Ba_2Ca_2Cu_3O_\delta$ ($0.08 \leq x \leq 0.41$, $7.625 \leq \delta \leq 9.15$), and has a crystal structure in which a blocking layer of $(Hg,Pb)O_z$-BaO-$CuO_2$-Ca-$CuO_2$-Ca-$CuO_2$-BaO is laminated in a c-axial direction of the crystal structure ($0.625 \leq z \leq 2.15$). Such an oxide superconductor exhibits excellent superconducting properties and is not harmful.

Further, the method of manufacturing an oxide superconductor, according to the present invention, comprises the steps of: mixing material powders of HgO, PbO, BaO, CaO and CuO at a mole ratio of $(Hg_{1-x}Pb_x)$: Ba:Ca:Cu=a:2:b:c ($1 \leq a \leq 2.5$, $2 \leq b \leq 3$, $2.5 \leq c \leq 4$) and compression-molding the mixture powder into a compact; and subjecting the compact to a thermal treatment at 600°–750° C. With the method, the oxide superconductor can be prepared at a high efficiency and a high reproducibility.

Furthermore, with the method of manufacturing a Hg-based oxide superconductor in which Pb is contained in the Hg site as solid solution, the oxide superconductor is rendered in an overdope state by the second thermal treatment in an oxygen gas atmosphere. Therefore, an oxide superconductor exhibiting excellent superconductors in a magnetic field can be obtained.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An oxide superconductor represented by $(Hg_{1-x}Pb_x)Ba_2Ca_2Cu_3O_\delta$ wherein $0.08 \leq x \leq 0.41$, $7.625 \leq \delta \leq 9.15$, and having a crystal structure in which a blocking layer of $(Hg, Pb)O_z$-$BaO$-$CuO_2$-$Ca$-$CuO_2$-$Ca$-$CuO_2$-$BaO$, wherein $0.625 \leq z \leq 2.15$, is laminated in a c-axial direction of the crystal structure.

2. A method of manufacturing an oxide superconductor, comprising the steps of:

mixing material powders of HgO, PbO, BaO, CaO and CuO at a mole ratio of $(Hg_{1-x}Pb_x)$:Ba:Ca:Cu=a:2:b:c wherein $1 \leq a \leq 2.5$, $2 \leq b \leq 3$, $2.5 \leq c \leq 4$, thereby obtaining mixture powder;

compression-molding the mixture powder, thereby obtaining a compact;

hermetically sealing said compact in a container; and subjecting the compact in the container to a first heat treatment at 600°–750° C., thereby obtaining said oxide superconductor.

3. A method according to claim 2, further comprising the step of subjecting said oxide superconductor to a second heat treatment in an argon gas atmosphere or an oxygen atmosphere, after the first heat treatment.

4. A method according to claim 3, wherein said second heat treatment is carried out at a temperature of 100° to 400° C.

5. A method according to claim 3, wherein said second heat treatment is carried out for a time period of at least 2 hours.

6. A method according to claim 2, wherein a pressure inside the container is reduced to about $1 \times 10^{-4}$ Torr.

7. A method according to claim 2, wherein said container is a quartz ampule.

8. A method according to claim 4, wherein an oxide superconductor is in an overdope state by the second heat treatment.

* * * * *